(12) United States Patent  
Kamada

(10) Patent No.: US 9,099,422 B2  
(45) Date of Patent: Aug. 4, 2015

(54) COMPOUND SEMICONDUCTOR DEVICE AND METHOD FOR MANUFACTURING THE SAME

(71) Applicant: FUJITSU LIMITED, Kawasaki-shi, Kanagawa (JP)

(72) Inventor: Youichi Kamada, Yamato (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 13/790,102

(22) Filed: Mar. 8, 2013

(65) Prior Publication Data

US 2013/0256754 A1   Oct. 3, 2013

(30) Foreign Application Priority Data

Mar. 28, 2012   (JP) .................. 2012-075004

(51) Int. Cl.  
*H01L 29/66* (2006.01)  
*H01L 29/15* (2006.01)  
(Continued)

(52) U.S. Cl.  
CPC .......... *H01L 29/36* (2013.01); *H01L 21/0254* (2013.01); *H01L 21/0262* (2013.01); *H01L 21/02581* (2013.01); *H01L 29/10* (2013.01); *H01L 29/66462* (2013.01); *H01L 29/7787* (2013.01); *H01L 23/49562* (2013.01); *H01L 29/2003* (2013.01); *H01L 29/207* (2013.01); (Continued)

(58) Field of Classification Search  
CPC ............ H01L 29/66462; H01L 29/0623; H01L 29/32; H01L 29/66431; H01L 29/4236; H01L 29/36; H01L 29/2003; H01L 29/10; H01L 29/7787; H01L 29/783; H01L 29/42316; H01L 29/1066; H01L 21/0254; H01L 21/02581

USPC ............... 257/194, 12, 94, 103, 99, 192, 471, 257/E29.246, 329.248, E29.251, E29.252, 257/E29.25, E29.253, E21.403, E21.407, 257/76; 438/172, 285

See application file for complete search history.

(56) References Cited

U.S. PATENT DOCUMENTS 8,742,459 B2 * 6/2014 Mishra et al. ................. 257/194  
2005/0194612 A1 * 9/2005 Beach ........................... 257/192  
(Continued)

FOREIGN PATENT DOCUMENTS

JP   2010-238752 A   10/2008  
JP   2009-206123 A1   9/2009  
(Continued)

OTHER PUBLICATIONS

Office Action mailed Jun. 5, 2014 from the Korean Intellectual Property Office in counterpart application No. 10-2013-30166 with English translation.

(Continued)

*Primary Examiner* — Julio J Maldonado  
*Assistant Examiner* — Moazzam Hossain  
(74) *Attorney, Agent, or Firm* — Kratz, Quintos & Hanson, LLP

(57) ABSTRACT

A compound semiconductor device includes: a substrate; an electron transit layer and electron supply layer formed over the substrate; a gate electrode, source electrode, and drain electrode formed over the electron supply layer; and a first Fe-doped layer provided between the substrate and the electron transit layer in a region corresponding to the position of the gate electrode in plan view, the first Fe-doped layer being doped with Fe to reduce two dimensional electron gas generated below the gate electrode.

13 Claims, 18 Drawing Sheets

(51) Int. Cl.
  *H01L 21/336* (2006.01)
  *H01L 29/36* (2006.01)
  *H01L 29/778* (2006.01)
  *H01L 29/10* (2006.01)
  *H01L 21/02* (2006.01)
  *H01L 29/20* (2006.01)
  *H01L 29/207* (2006.01)
  *H01L 23/495* (2006.01)

(52) U.S. Cl.
  CPC .................. *H01L 2224/0603* (2013.01); *H01L 2224/32245* (2013.01); *H01L 2224/48247* (2013.01); *H01L 2224/48257* (2013.01); *H01L 2224/48472* (2013.01); *H01L 2224/73265* (2013.01)

(56) References Cited

U.S. PATENT DOCUMENTS

2009/0001478 A1    1/2009  Okamoto
2009/0072272 A1*   3/2009  Suh et al. ...................... 257/194
2009/0101939 A1*   4/2009  Smith et al. ................... 257/194
2009/0212326 A1    8/2009  Sato
2010/0117118 A1*   5/2010  Dabiran et al. ............... 257/190
2010/0244041 A1*   9/2010  Oishi et al. ..................... 257/76
2010/0289067 A1*  11/2010  Mishra et al. ................. 257/268
2011/0109241 A1*   5/2011  Kitamura ...................... 315/291
2012/0098599 A1*   4/2012  Chang et al. .................. 330/277

FOREIGN PATENT DOCUMENTS

JP    2010-199409 A    9/2010
JP    2011-82415 A1    4/2011
TW    200908320        2/2009

OTHER PUBLICATIONS

Taiwanese Office Action dated Jan. 27, 2015 in corresponding Taiwanese Application No. 102109608 (with English translation).

* cited by examiner (e)

(f)

(g)

(h)

(i)

(j)

(a)

(b)

(c)

(d)

(e)

(f)

(g)

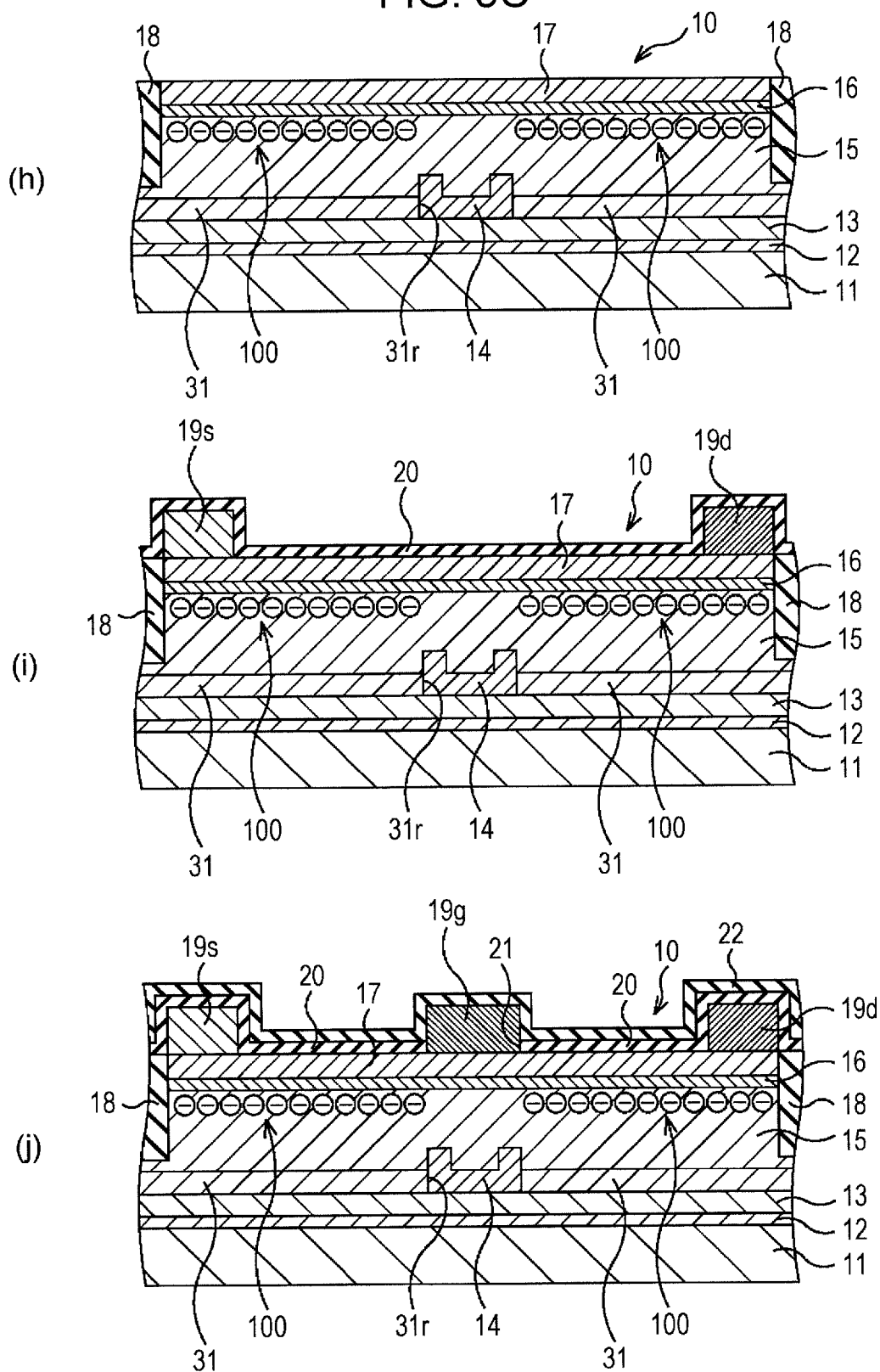

(e)

(f)

(g)

COMPOUND SEMICONDUCTOR DEVICE AND METHOD FOR MANUFACTURING THE SAME

CROSS-REFERENCE TO RELATED APPLICATION(S)

This application is based upon and claims the benefit of priority of the prior Japanese Patent Application No. 2012-75004, filed on Mar. 28, 2012, the entire contents of which are incorporated herein by reference.

FIELD

The embodiments discussed herein are related to a compound semiconductor device and a method for manufacturing the compound semiconductor device.

BACKGROUND

In recent years, compound semiconductor devices with high dielectric strength and high power have been intensively developed, in which the characteristics of nitride compound semiconductors, such as exhibiting high saturated electron velocity and a broad band gap, are utilized.

For example, field effect transistors such as a high electron mobility transistor (HEMT) have been developed. In particular, a GaN HEMT having an AlGaN layer being an electron supply layer is attracting attention.

In the GaN HEMT, difference in a lattice constant between AlGaN and GaN causes strain in the AlGaN layer, and the strain induces piezoelectric polarization, which generates high-concentration two dimensional electron gas in the vicinity of the upper surface of the GaN layer underlying the AlGaN layer. Such a phenomenon enables generation of high power.

The high-concentration two dimensional electron gas, however, becomes problematic in operation of normally-off transistors. A wide variety of techniques have been studied to overcome this problem. For example, techniques have been proposed, in which a p-type GaN layer doped with Mg being a p-type dopant is provided to reduce the two dimensional electron gas. The p-type GaN layer is provided between an electron supply layer and a gate electrode in some techniques or between a buffer layer and an electron transit layer in the other techniques.

Unfortunately, related art GaN HEMTs having p-type GaN layers do not have proper device characteristics in some cases while operating in a normally-off mode.

Examples of related art compound semiconductor devices are disclosed in Japanese Laid-open Patent Publication Nos. 2009-206123 and 2011-82415.

SUMMARY

According to an aspect of the invention, a compound semiconductor device includes: a substrate; an electron transit layer and electron supply layer formed over the substrate; a gate electrode, source electrode, and drain electrode formed over the electron supply layer; and a first Fe-doped layer provided between the substrate and the electron transit layer in a region corresponding to the position of the gate electrode in plan view, the first Fe-doped layer being doped with Fe to reduce two dimensional electron gas generated below the gate electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5C is a set of cross-sectional views illustrating processes subsequent to the processes illustrated in FIG. 5B for manufacturing the compound semiconductor device according to the second embodiment in sequence;

DESCRIPTION OF EMBODIMENTS

In order to enable operation in a normally-off mode, the inventor has researched the cause of unsatisfactory output in a GaN HEMT having a p-type GaN layer. Then, the inventor has found that formation of a p-type GaN layer between a gate electrode and an electron supply layer involves etching the p-type GaN layer and the electron supply layer is damaged during the etching process with the result that this damage induces generation of a number of traps. In addition, the inventor has found that formation of a p-type GaN layer between a buffer layer and an electron transit layer causes broad diffusion of Mg in the subsequent process for forming another compound semiconductor layer with the result that the diffused Mg influences device characteristics. In view of the finding, the inventor has discovered that an Fe-doped compound semiconductor layer is formed so as to underlie an electron transition layer in place of a p-type GaN layer doped with Mg for operation in a normally-off mode.

Embodiments will now be described in detail with reference to the accompanying drawings.

First Embodiment

Figure 1:
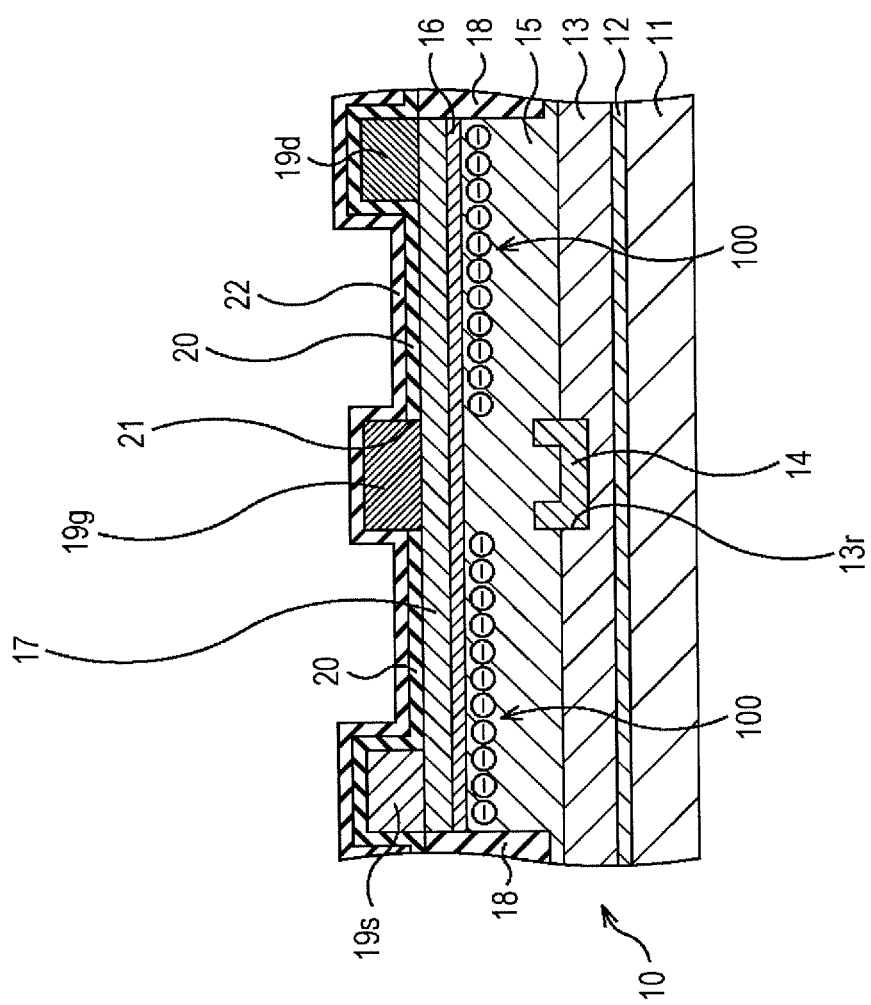
FIG. 1 is a cross-sectional view illustrating the configuration of a compound semiconductor device according to a first embodiment.

A first embodiment will now be described. FIG. 1 is a cross-sectional view illustrating the configuration of a GaN HEMT (compound semiconductor device) of the first embodiment.

In the first embodiment, with reference to FIG. 1, a compound semiconductor multilayer structure 10 is formed on a substrate 11 such as an Si substrate. The compound semiconductor multilayer structure 10 includes an initial layer 12, a buffer layer 13, an electron transit layer 15, a spacer layer 16, and an electron supply layer 17. The initial layer 12 is, for instance, an AlN layer having a thickness of 1 nm to 300 nm (e.g., 160 nm). The buffer layer 13 is, for example, an AlGaN layer having a thickness of approximately 1 nm to 300 nm (e.g., 150 nm). The electron transit layer 15 is, for instance, an i-GaN layer having a thickness of approximately 3 μm and intentionally undoped with a dopant. The spacer layer 16 is, for instance, an i-AlGaN layer having a thickness of approximately 5 nm and intentionally undoped with a dopant. The electron supply layer 17 is, for example, an n-AlGaN layer doped with an n-type dopant and having a thickness of approximately 30 nm. The electron supply layer 17 is, for instance, doped with Si being an n-type dopant at a concentration of approximately $5 \times 10^{18}$ cm$^{-3}$.

A device isolation region 18 is provided to the compound semiconductor multilayer structure 10 to define a device region. In the device region, a source electrode 19s and a drain electrode 19d are formed on the electron supply layer 17. An insulating film 20 is formed on the electron supply layer 17 so as to cover the source electrode 19s and the drain electrode 19d. The insulating film 20 has an opening 21 formed between the source electrode 19s and the drain electrode 19d, and a gate electrode 19g is formed so as to be in Schottky contact with the electron supply layer 17 through the opening 21. An insulating film 22 is formed on the insulating film 20 so as to cover the gate electrode 19g. The insulating films 20 and 22 may be formed from any material; for example, an Si nitride film is employed. The insulating films 20 and 22 exemplify terminated films.

A recess 13r is formed in the buffer layer 13 at the site corresponding to the position of the gate electrode 19g in plan view. The recess 13r has a depth of, for example, 100 nm to 500 nm. A two dimensional electron gas (2DEG) suppression layer 14 is formed in the recess 13r. The 2DEG suppression layer 14 is, for instance, an Fe-doped GaN layer. Fe is incorporated at a concentration that enables 2DEG just below the gate electrode 19g to be reduced; for example, not less than $1 \times 10^{17}$ cm$^{-3}$. A preferred Fe concentration is not less than $2 \times 10^{17}$ cm$^{-3}$. The electron transit layer 15 is formed so as to cover the 2DEG suppression layer 14. The 2DEG suppression layer 14 is also the constituent of the compound semiconductor multilayer structure 10. In other words, in the present embodiment, the Fe-doped 2DEG suppression layer 14 is positioned between the substrate 11 and the electron transit layer 15 in a region corresponding to the position of the gate electrode 19g in plan view. The 2DEG suppression layer 14 exemplifies an Fe-doped layer.

In the GaN HEMT having such a structure, 2DEG 100 is generated in the vicinity of the upper surface of the electron transit layer 15. However, since the Fe-doped 2DEG suppression layer 14 is formed with a dopant concentration which enables 2DEG 100 to be reduced, the conduction band ($E_C$) is at a high energy level below the gate electrode 19g, so that the conduction band ($E_C$) does not substantially have a region lower than Fermi level ($E_F$). Hence, in a state in which a voltage applied to the gate electrode 19g is 0 V, namely, an off-state, the 2DEG 100 does not exist below the gate electrode 19g, which enables operation in a normally-off mode. Since Fe is less likely to be diffused in a compound semiconductor layer as compared with Mg, device characteristics are less likely to be impaired by the diffusion of Fe even though the electron transit layer 15 or another component is formed after formation of the 2DEG suppression layer 14.

Figure 2:
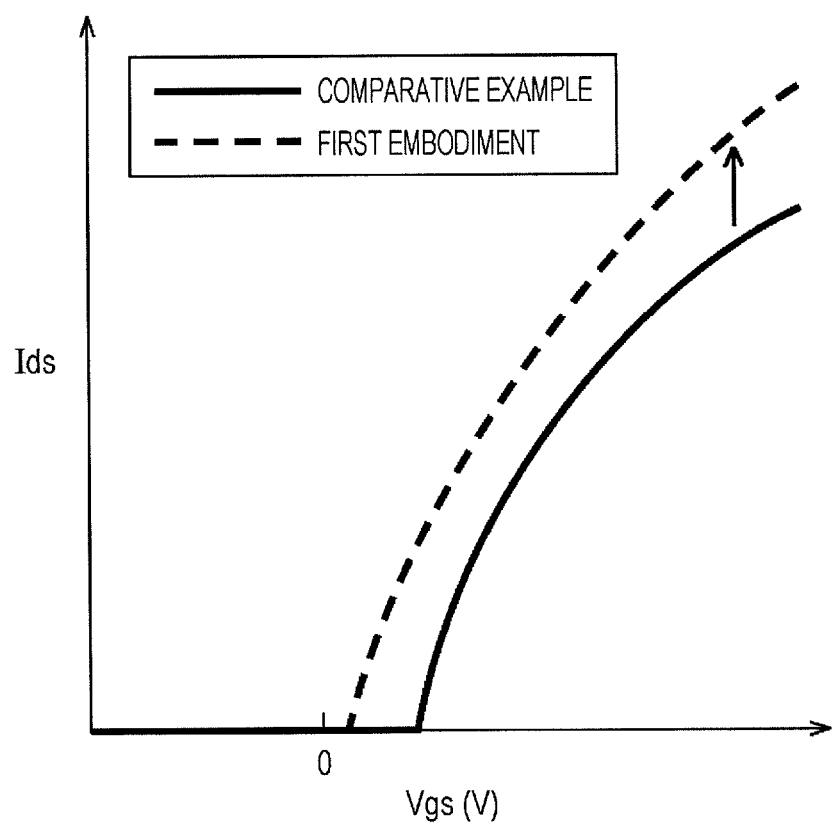
FIG. 2 is a diagram illustrating device characteristics according to the first embodiment.

As compared with a comparative example in which a p-type GaN layer is provided between a gate electrode and an electron supply layer in place of the 2DEG suppression layer 14 for operation in a normally-off mode, high on-current is advantageously obtained in the first embodiment as illustrated in FIG. 2. This is because the first embodiment does not involve an etching process generally employed in the formation of the p-type GaN layer and is therefore free from damage of the electron supply layer 17 due to the etching process. In FIG. 2, the horizontal axis represents a gate-source-voltage (Vgs), and the vertical axis represents drain source voltage (Ids).

The 2DEG suppression layer 14 with a higher Fe concentration enables the 2DEG 100 just below the gate electrode 19g to be further steadily reduced, which enables operation in a normally-off mode; however, an extraordinarily high Fe concentration may cause a gate voltage for on-mode operation to be increased. Hence, the Fe concentration of the 2DEG suppression layer 14 is preferably determined in view of such a circumstance.

A method for manufacturing the GaN HEMT (compound semiconductor device) of the first embodiment will now be described. FIGS. 3A to 3D are cross-sectional views each illustrating a method for manufacturing the GaN HEMT (compound semiconductor device) of the first embodiment in a process sequence.

Figure 3A:
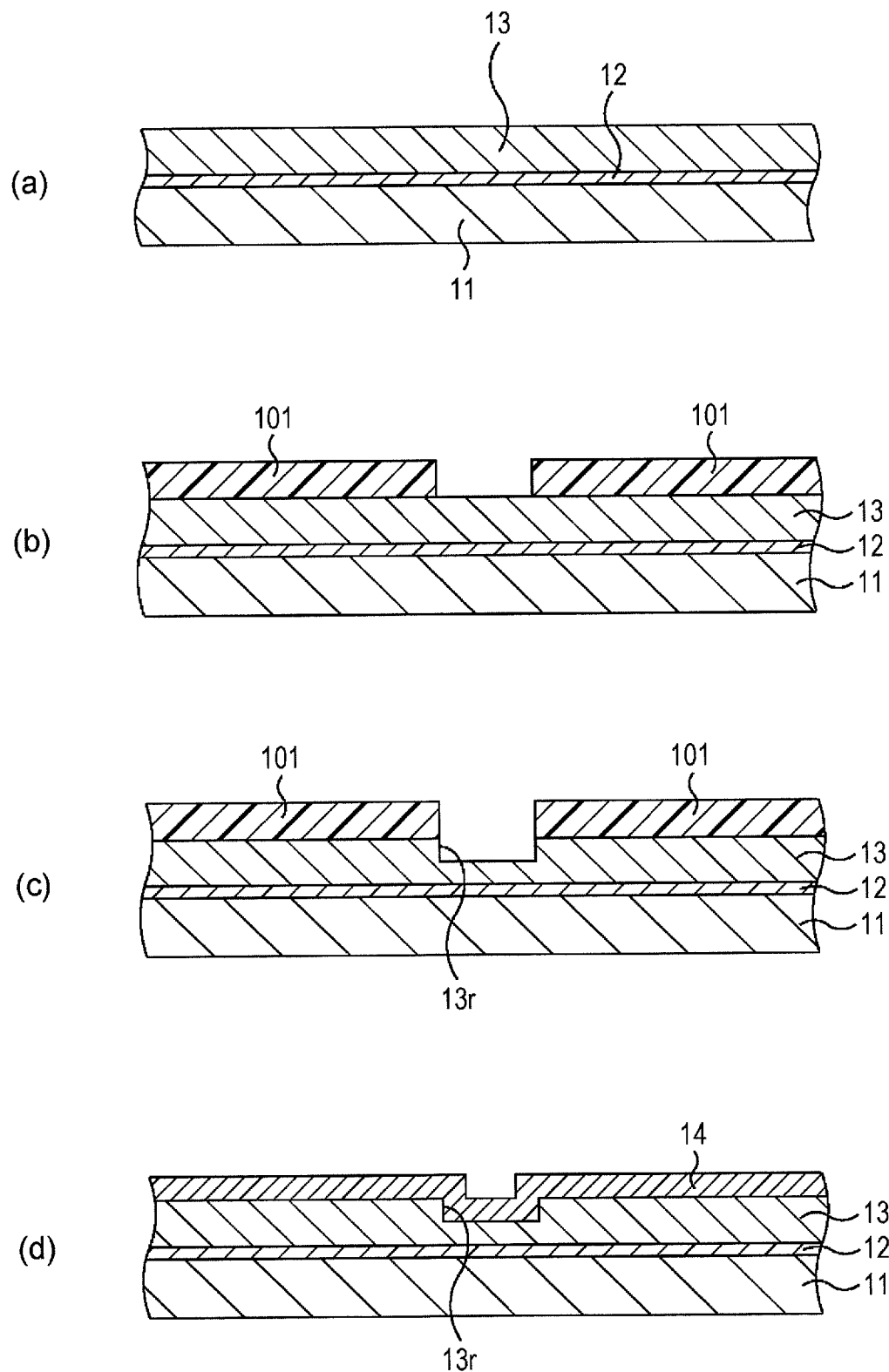
FIG. 3A is a set of cross-sectional views illustrating processes for manufacturing the compound semiconductor device according to the first embodiment in sequence.

As illustrated in FIG. 3A, in Process (a), the initial layer 12 and the buffer layer 13 are formed so as to overlie the substrate 11. The initial layer 12 and the buffer layer 13 are, for example, deposited by metal organic vapor phase epitaxy (MOVPE). Then, in Process (b) in FIG. 3A, a resist pattern 101 is formed on the buffer layer 13 such that a predetermined site for formation of the recess 13r is exposed and the other region is covered. Then, in Process (c) in FIG. 3A, the recess 13r is formed in the buffer layer 13 through a dry etching procedure utilizing the resist pattern 101 as an etching mask. The resist pattern 101 is subsequently removed. Then, in Process (d) in FIG. 3A, the 2DEG suppression layer 14 is formed on the buffer layer 13. The 2DEG suppression layer 14 is formed, for example, so as to have a thickness in which the upper surface of the 2DEG suppression layer 14 in the recess 13*r* is higher than the upper surface of the other region of the buffer layer 13 than the recess 13*r*.

Figure 3B:
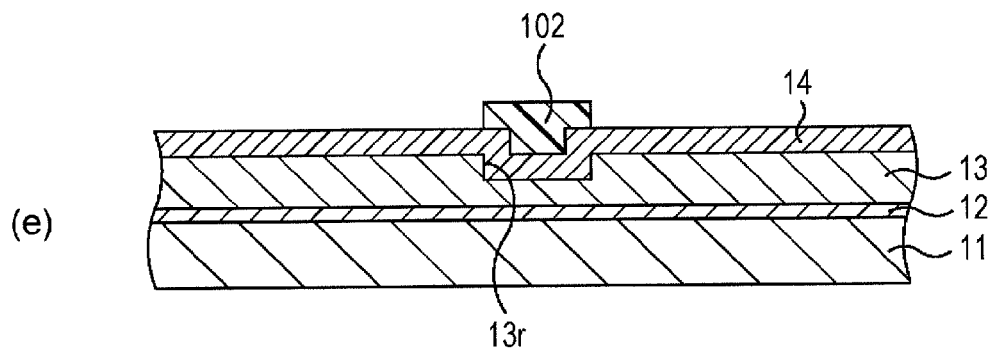
FIG. 3B is a set of cross-sectional views illustrating processes subsequent to the processes illustrated in FIG. 3A for manufacturing the compound semiconductor device according to the first embodiment in sequence.
Figure 3B:
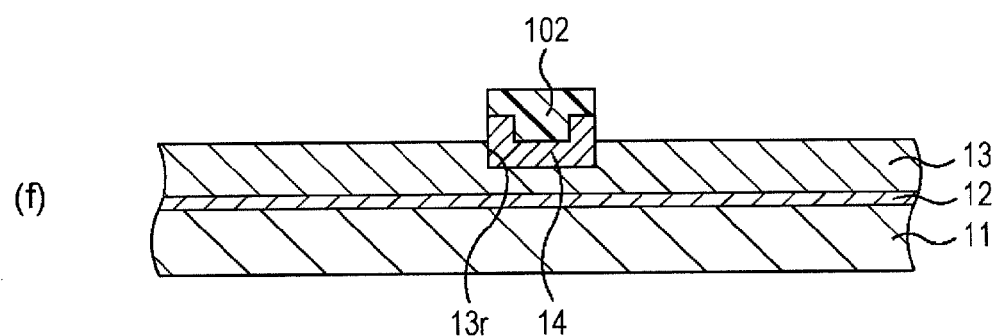
Figure 3B:
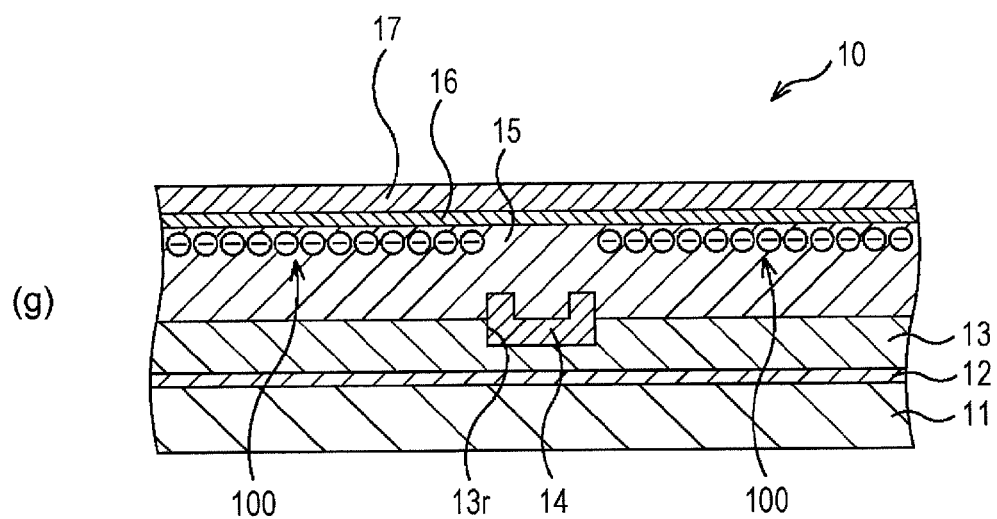

As illustrated in FIG. 3B, in Process (e), a resist pattern 102 is then formed on the 2DEG suppression layer 14 such that the site to be left as the 2DEG suppression layer 14 is covered and the other region is exposed. Then, in Process (f) in FIG. 3B, a dry etching procedure utilizing the resist pattern 102 as an etching mask is carried out to remove the other region of the 2DEG suppression layer 14 than the site covered with the resist pattern 102. The resist pattern 102 is subsequently removed. Then, in Process (g) in FIG. 3B, the electron transit layer 15 is formed on the buffer layer 13 so as to cover the 2DEG suppression layer 14, and the spacer layer 16 and the electron supply layer 17 are formed so as to overlie the electron transit layer 15. The electron transit layer 15, the spacer layer 16, and the electron transport layer 17 are, for instance, deposited by MOVPE. These processes enable production of the compound semiconductor multilayer structure 10 including the initial layer 12, the buffer layer 13, the 2DEG suppression layer 14, the electron transit layer 15, the spacer layer 16, and the electron supply layer 17. The 2DEG 100 is generated in the vicinity of the upper surface of the electron transit layer 15 except the region just above the 2DEG suppression layer 14.

In the formation of the compound semiconductor layers included in the compound semiconductor multilayer structure 10, for example, mixed gas of trimethylaluminum (TMA) gas being an Al source, trimethylgallium (TMG) gas being a Ga source, and ammonia ($NH_3$) gas being an N source is used. The presence or absence and flow rate of trimethylaluminum and trimethylgallium gas to be fed are determined depending on the composition of a compound semiconductor layer to be deposited. The flow rate of ammonia gas being the material common to each compound semiconductor layer is approximately 100 ccm to 10 LM. Furthermore, for instance, deposition pressure is approximately 50 Torr to 300 Torr, and deposition temperature is approximately in the range of 1000° C. to 1200° C. In order to deposit an n-type compound semiconductor layer (e.g., electron supply layer 17), for instance, $SiH_4$ gas containing Si is added to the mixed gas at a predetermined flow rate to dope the compound semiconductor layer with Si. The concentration of Si as a dopant is approximately in the range of $1 \times 10^{18}$ $cm^{-3}$ to $1 \times 10^{20}$ $cm^{-3}$, for example, approximately $5 \times 10^{18}$ $cm^{-3}$. In order to deposit an Fe-doped compound semiconductor layer (e.g., 2DEG suppression layer 14), for example, Fe-containing gas is synthesized from gas of an Fe compound, such as $Cp_2Fe$ (cyclopentadienyliron, ferrocene), and hydrogen chloride gas, and the resulting gas is added to the mixed gas. Use of the mixed gas composed of gallium-containing gas and nitrogen-containing gas enables formation of the Fe-doped GaN layer. The concentration of Fe incorporated into the 2DEG suppression layer 14 is not less than $1 \times 10^{17}$ $cm^{-3}$.

Figure 3C:
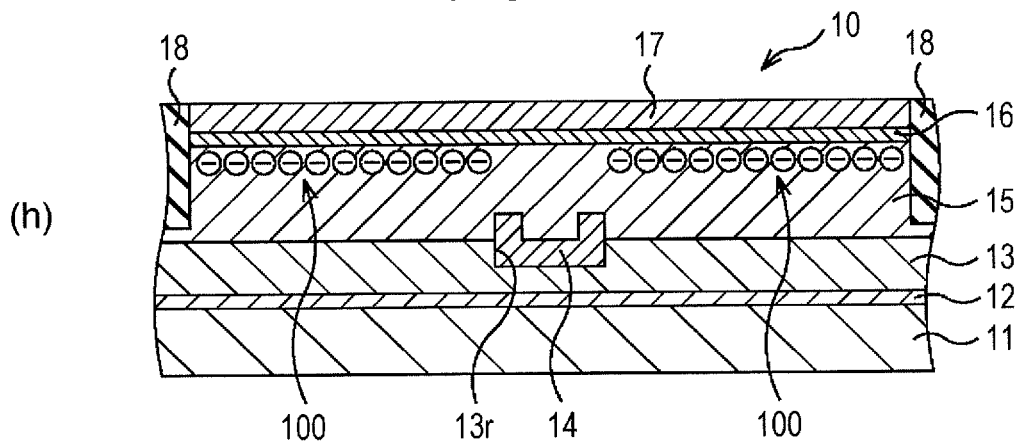
FIG. 3C is a set of cross-sectional views illustrating processes subsequent to the processes illustrated in FIG. 3B for manufacturing the compound semiconductor device according to the first embodiment in sequence.
Figure 3C:
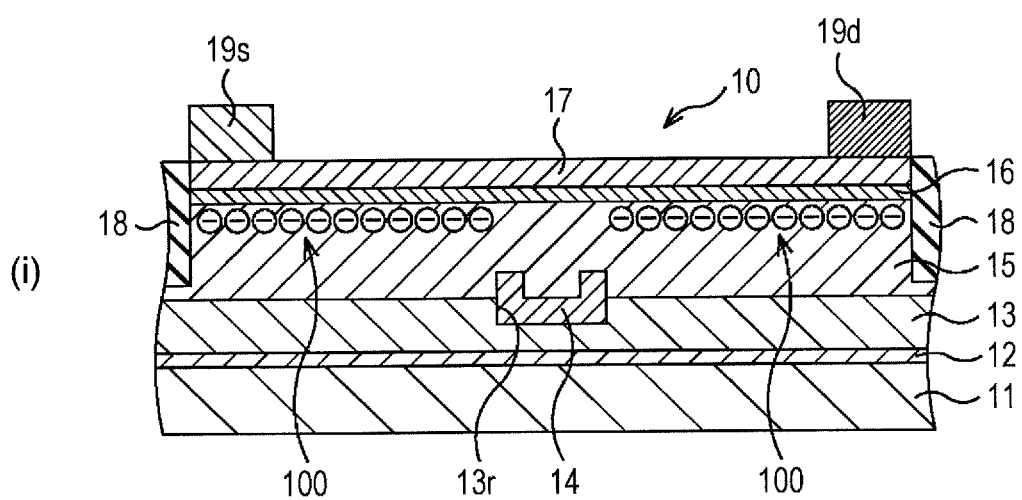
Figure 3C:
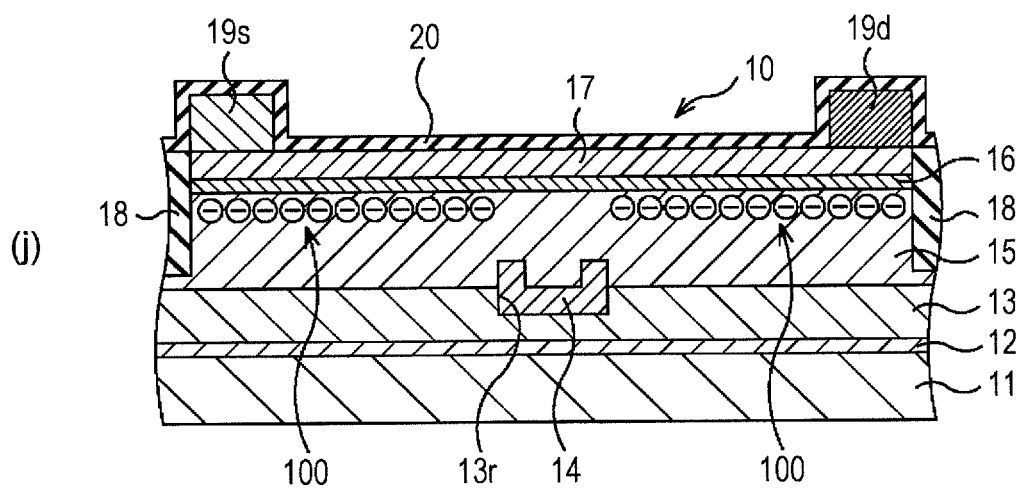

As illustrated in FIG. 3C, in Process (h), the device isolation region 18 is then provided to the compound semiconductor multilayer structure 10 to define a device region. In order to form the device isolation region 18, for example, a patterned photoresist is formed on the electron supply layer 17 such that a predetermined region for formation of the device isolation region 18 is exposed, and the patterned photoresist is utilized as a mask to carry out ion implantation of Ar. A dry etching procedure using chlorine-based gas may be carried out while utilizing this patterned photoresist as an etching mask. Then, in Process (i) in FIG. 3C, the source electrode 19*s* and the drain electrode 19*d* are formed on the electron supply layer 17 such that the 2DEG suppression layer 14 is interposed therebetween in plan view. The source electrode 19*s* and the drain electrode 19*d* may be, for instance, formed by a lift-off technique. In particular, a patterned photoresist is formed such that predetermined regions for formation of the source electrode 19*s* and drain electrode 19*d* are exposed and the other region is covered, metallic films are formed by a vapor deposition method using the patterned photoresist as a deposition mask, and then the patterned photoresist is removed together with the metallic films formed thereon. In the formation of the metallic mask, for instance, formation of a Ti film is followed by formation of an Al film. Then, for example, the product was heated at a temperature ranging from 400° C. to 1000° C. (e.g., 550° C.) under a nitrogen atmosphere to secure ohmic characteristics. After the formation of the source electrode 19*s* and drain electrode 19*d*, the insulating film 20 is formed on the electron supply layer 17 so as to cover the source electrode 19*s* and the drain electrode 19*d* in Process (j) in FIG. 3C. The insulating film 20 is preferably formed by, for example, an atomic layer deposition (ALD) method, a plasma chemical vapor deposition (CVD) method, or a sputtering method.

Figure 3D:
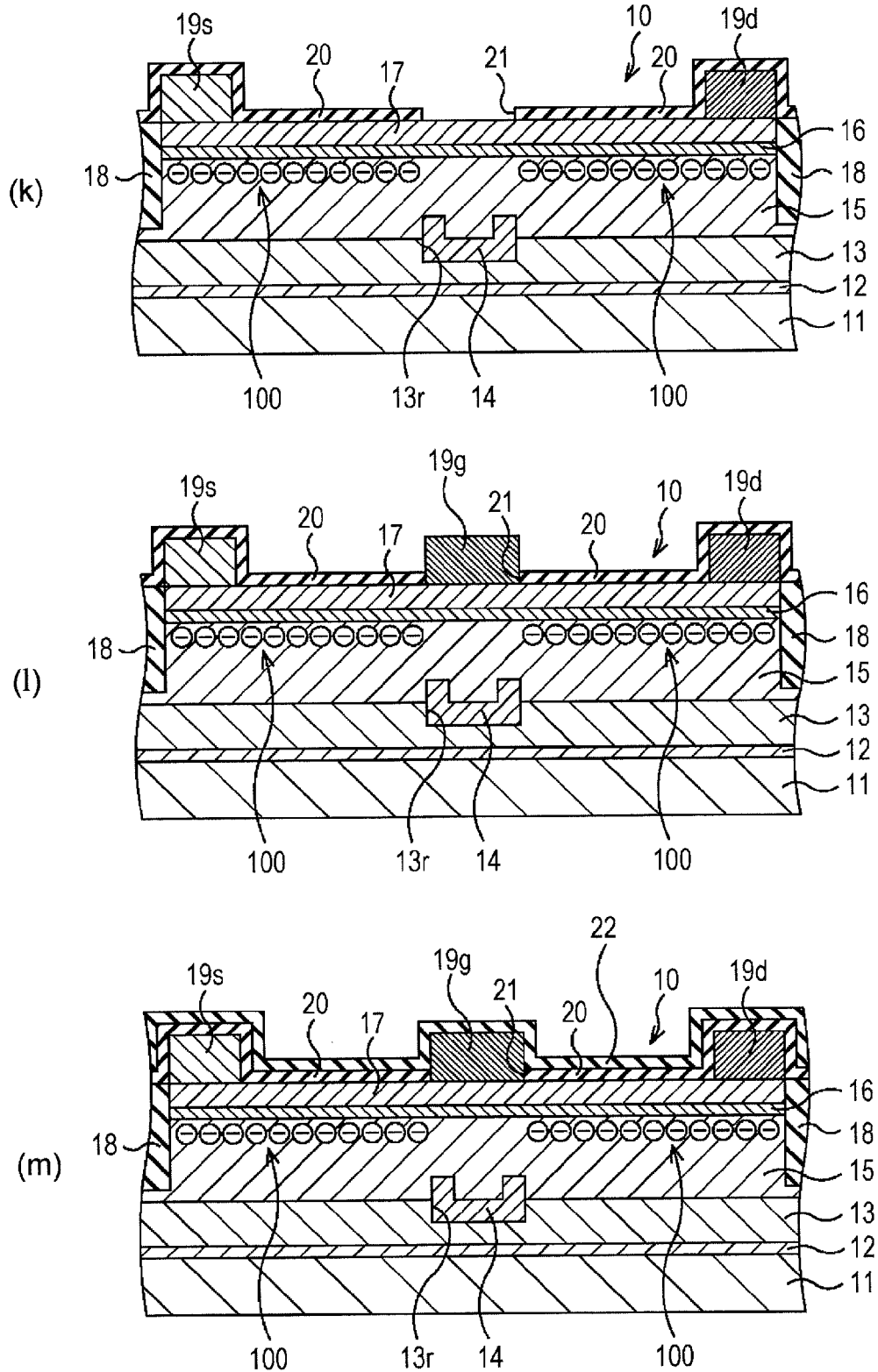
FIG. 3D is a set of cross-sectional views illustrating processes subsequent to the processes illustrated in FIG. 3C for manufacturing the compound semiconductor device according to the first embodiment in sequence.

As illustrated in FIG. 3D, in Process (k), the opening 21 is then formed in a predetermined region of the insulating film 20 for formation of a gate electrode; for instance, the region above the 2DEG suppression layer 14. The opening 21 is formed by, for example, dry etching, wet etching, or ion milling. Then, in Process (l) in FIG. 3D, the gate electrode 19*g* is formed in the opening 21. The gate electrode 19*g* may be, for instance, formed by a lift-off technique. In particular, a patterned photoresist is formed such that a predetermined region for formation of the gate electrode 19*g* is exposed, metallic films are formed by a vapor deposition method using the patterned photoresist as a deposition mask, and then the patterned photoresist is removed together with the metallic films formed thereon. In the formation of the metallic mask, for instance, formation of an Ni film is followed by formation of an Au film. After the formation of the gate electrode 19*g*, the insulating film 22 is formed on the insulating film 20 so as to cover the gate electrode 19*g*. The insulating film 22 is preferably formed by, for example, an ALD method, a plasma CVD method, or a sputtering method as in the formation of the insulating film 20.

These processes enables production of the GaN HEMT of the first embodiment.

Second Embodiment

Figure 4:
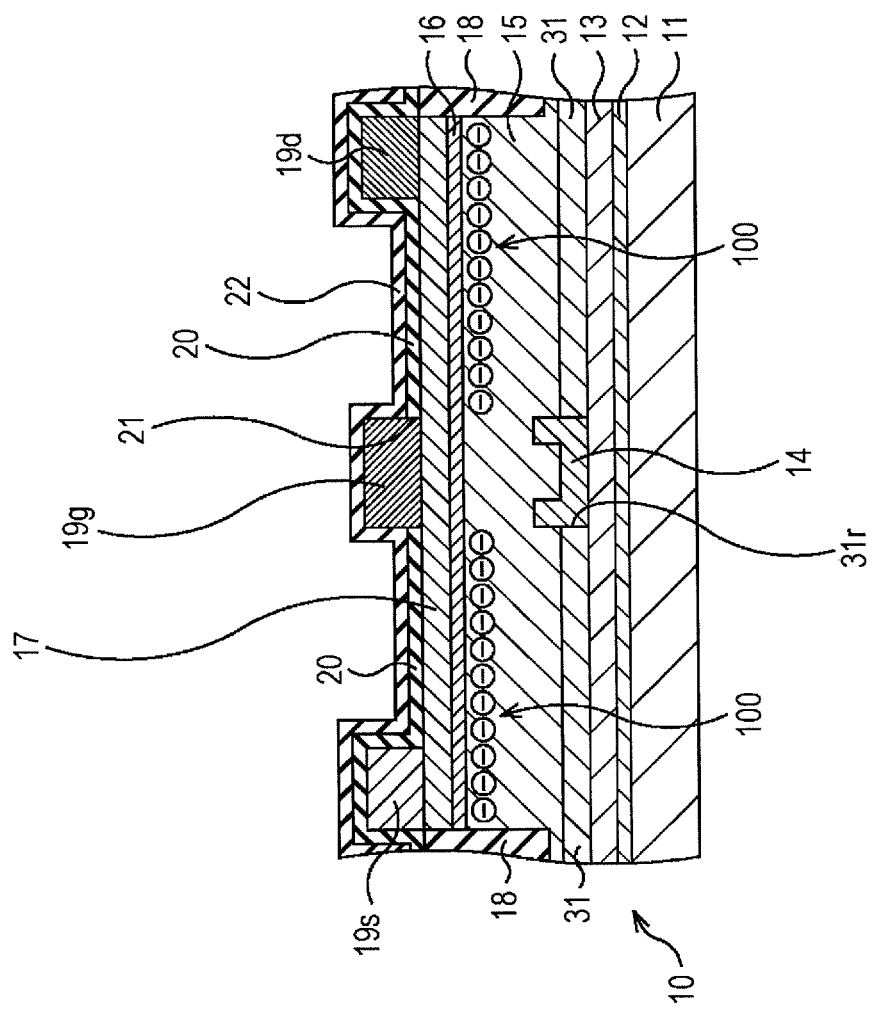
FIG. 4 is a cross-sectional view illustrating the configuration of a compound semiconductor device according to a second embodiment.

A second embodiment will now be described. In the first embodiment, traps are slightly generated in the vicinity of the lower surface of the electron transit layer 15, which influences device characteristic in some cases. In the second embodiment, such generation of traps is reduced. FIG. 4 is a cross-sectional view illustrating the configuration of a GaN HEMT (compound semiconductor device) of the second embodiment.

In the first embodiment, the 2DEG suppression layer 14 is formed in the recess 13*r* of the buffer layer 13; in contrast, in the second embodiment, as illustrated in FIG. 4, a trap suppression layer 31 is formed on the buffer layer 13, and the 2DEG suppression layer 14 is formed in a recess 31*r* formed in the trap suppression layer 31. The trap suppression layer 31 has a thickness, for example, ranging from 100 nm to 500 nm.

Examples of the trap suppression layer 31 include a GaN layer doped with Fe at a concentration lower than the Fe concentration of the 2DEG suppression layer 14. The trap suppression layer 31 has such an Fe concentration that enables traps generated in the vicinity of the lower surface of the electron transit layer 15 to be reduced; for instance, less than $1\times10^{17}$ cm$^{-3}$. A preferred Fe concentration is not more than $5\times10^{16}$ cm$^{-3}$. The electron transit layer 15 is formed so as to cover the 2DEG suppression layer 14 and the trap suppression layer 31. The trap suppression layer 31 is also the constituent of the compound semiconductor multilayer structure 10. In particular, in the present embodiment, the trap suppression layer 31 doped with Fe is provided between the substrate 11 and the electron transit layer 15 so as to be positioned on both the source electrode 19s side and the drain electrode 19d side relative to the 2DEG suppression layer 14. The source electrode 19s-side site of the trap suppression layer 31 exemplifies a second Fe-doped layer, and the drain electrode 19d-side site of the trap suppression layer 31 exemplifies a third Fe-doped layer. The other configurations are the same as those of the first embodiment.

The GaN HEMT having such a structure enables a reduction in traps generated in the vicinity of the lower surface of the electron transit layer 15. If traps are generated in the vicinity of the lower surface of the electron transit layer 15, unwanted electric current flows through the vicinity of the traps, which influences device characteristics. In contrast, the present embodiment enables such an influence to be reduced, leading to more satisfactory device characteristics.

Figure 5A:
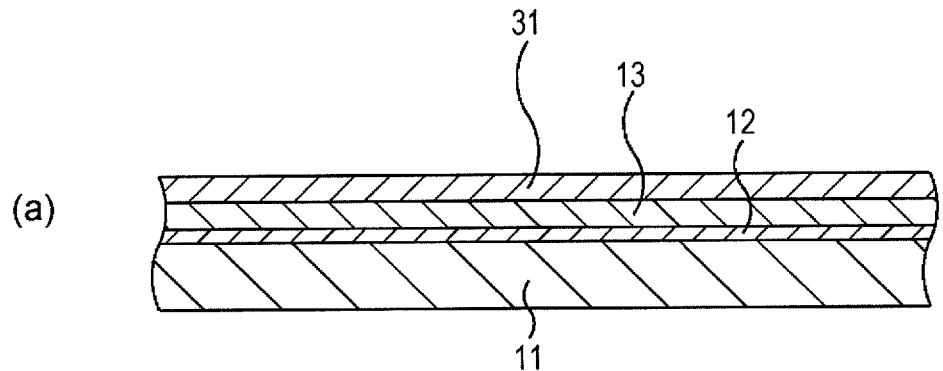
FIG. 5A is a set of cross-sectional views illustrating processes for manufacturing the compound semiconductor device according to the second embodiment in sequence.
Figure 5A:
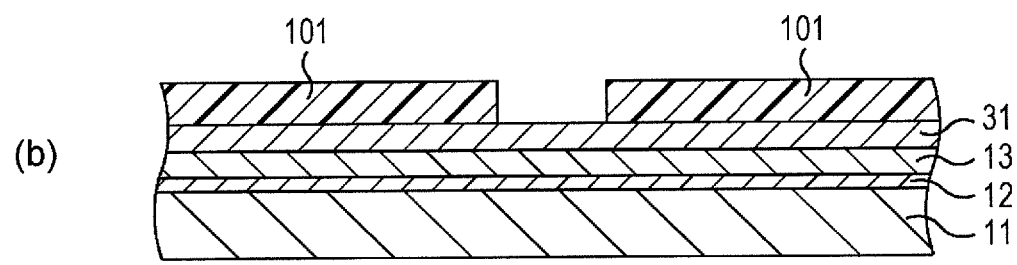
Figure 5A:
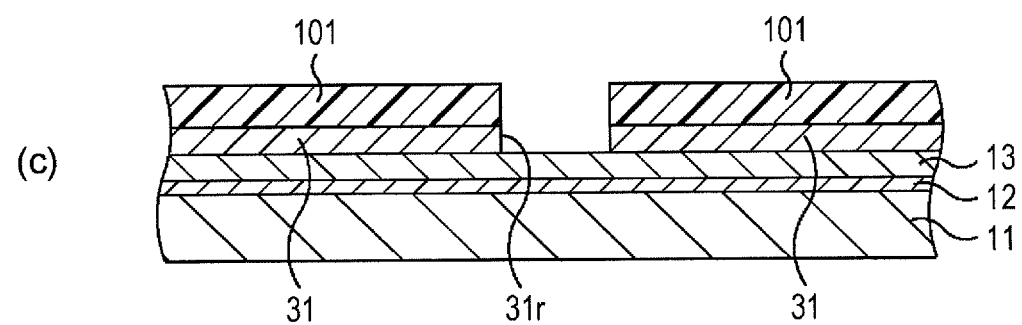
Figure 5A:
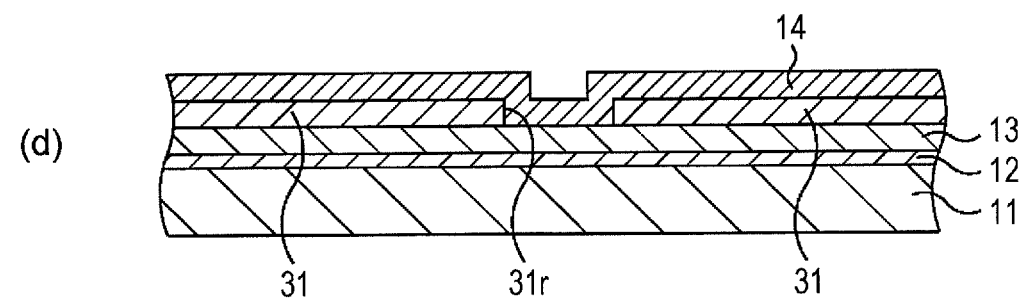
Figure 5B:
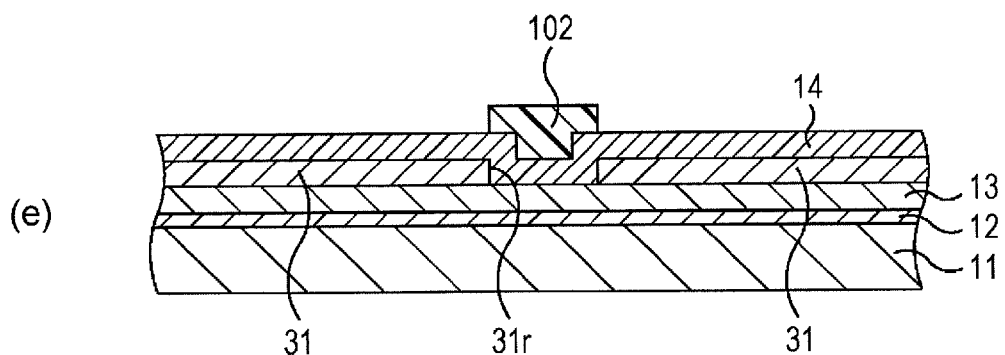
FIG. 5B is a set of cross-sectional views illustrating processes subsequent to the processes illustrated in FIG. 5A for manufacturing the compound semiconductor device according to the second embodiment in sequence.
Figure 5B:
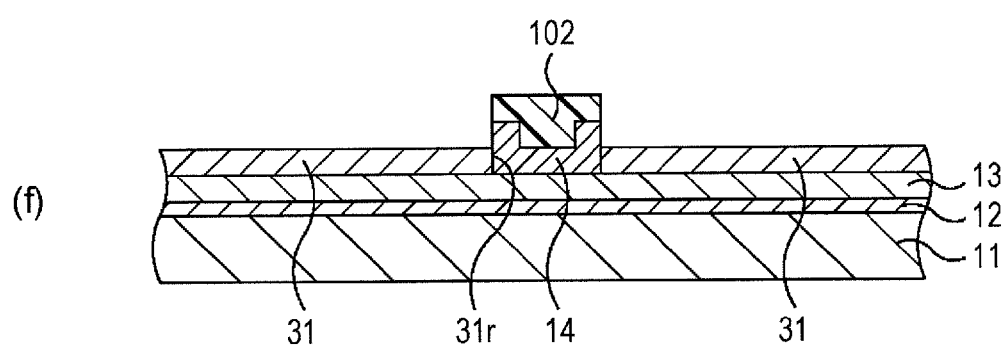
Figure 5B:
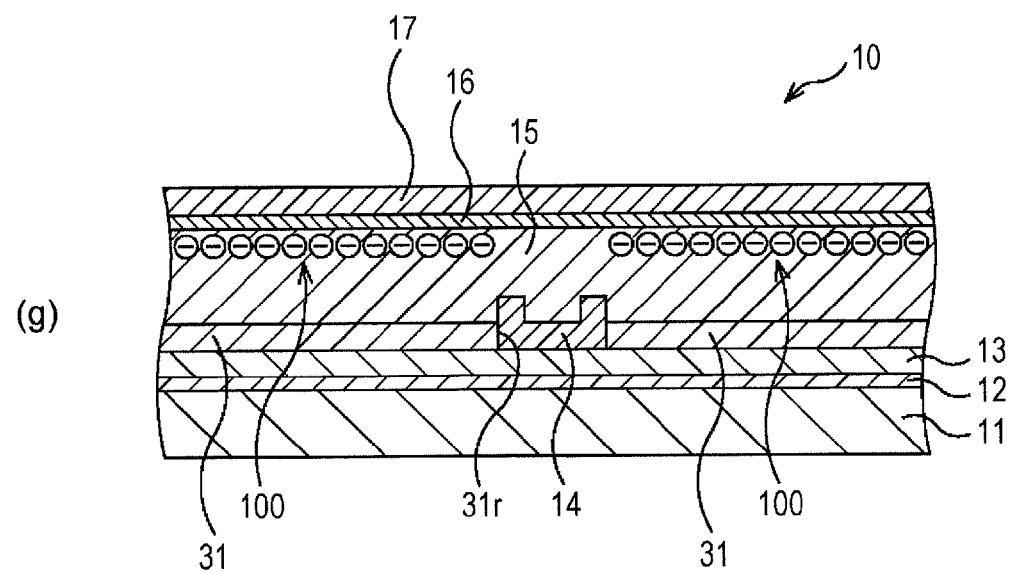

A method for manufacturing the GaN HEMT (compound semiconductor device) of the second embodiment will now be described. FIGS. 5A to 5C are cross-sectional views each illustrating a method for manufacturing the GaN HEMT (compound semiconductor device) of the second embodiment in a process sequence.

The same procedures as those in the first embodiment are carried out until the formation of the buffer layer 13. The thickness of the buffer layer 13 may be reduced, for example, in a degree corresponding to the thickness of the trap suppression layer 31. As illustrated in FIG. 5A, in Process (a), the trap suppression layer 31 is then formed on the buffer layer 13. Then, in Process (b) in FIG. 5A, the resist pattern 101 is formed on the trap suppression layer 31 such that a predetermined site for formation of the recess 31r is exposed and the other region is covered. Then, in Process (c) in FIG. 5A, the recess 31r is formed in the trap suppression layer 31 through a dry etching procedure utilizing the resist pattern 101 as an etching mask. The resist pattern 101 is subsequently removed. Then, in Process (d) in FIG. 5A, the 2DEG suppression layer 14 is formed on the buffer layer 13 and the trap suppression layer 31. The 2DEG suppression layer 14 is formed, for example, so as to have the thickness approximately the same as that of the trap suppression layer 31.

As illustrated in FIG. 5B, in Process (e), the resist pattern 102 is then formed on the 2DEG suppression layer 14 such that the site to be left as the 2DEG suppression layer 14 is covered and the other region is exposed. Then, in Process (f) in FIG. 5B, a dry etching procedure utilizing the resist pattern 102 as an etching mask is carried out to remove the other region of the 2DEG suppression layer 14 than the site covered with the resist pattern 102. The resist pattern 102 is subsequently removed. Then, in Process (g) in FIG. 5B, the electron transit layer 15 is formed on the trap suppression layer 31 so as to cover the 2DEG suppression layer 14 as in the first embodiment, and the spacer layer 16 and the electron supply layer 17 are formed so as to overlie the electron transit layer 15. These processes enable production of the compound semiconductor multilayer structure 10 including the initial layer 12, the buffer layer 13, the 2DEG suppression layer 14, the electron transit layer 15, the spacer layer 16, the electron supply layer 17, and the trap suppression layer 31. The 2DEG 100 is generated in the vicinity of the upper surface of the electron transit layer 15 except the region just above the 2DEG suppression layer 14.

As illustrated in FIG. 5C, in Process (h), the device isolation region 18 is then provided to the compound semiconductor multilayer structure 10 as in the first embodiment. Then, in Process (i) in FIG. 5C, as in the first embodiment, the source electrode 19s and the drain electrode 19d are formed, and the insulating film 20 is formed on the electron supply layer 17. Then, in Process (j) in FIG. 5C, the subsequent procedures from the formation of the opening 21 are carried out.

These processes enable the GaN HEMT of the second embodiment to be produced.

Third Embodiment

Figure 6:
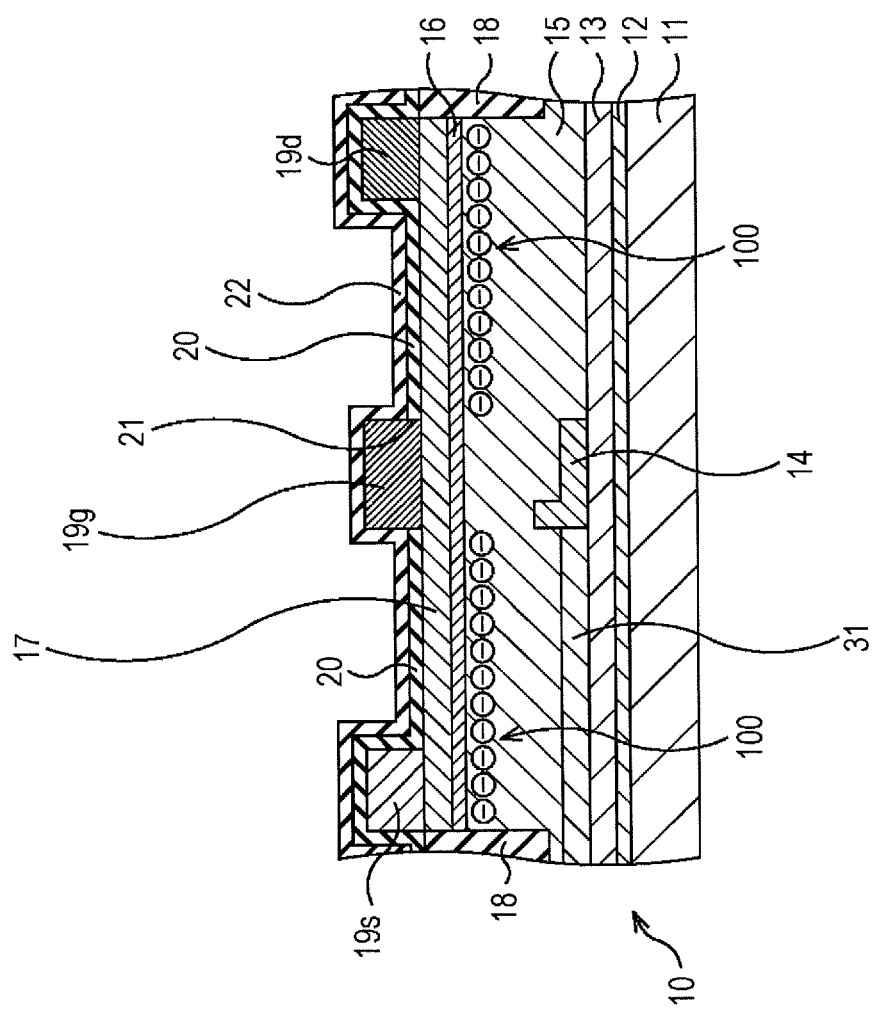
FIG. 6 is a cross-sectional view illustrating the configuration of a compound semiconductor device according to a third embodiment.

A third embodiment will now be described. Although the trap suppression layer 31 is provided on both the source electrode 19s side and the drain electrode 19d side relative to the 2DEG suppression layer 14 in the second embodiment, the trap suppression layer 31 may be provided on any one of these sides. FIG. 6 is a cross-sectional view illustrating the configuration of a GaN HEMT (compound semiconductor device) of the third embodiment.

In the third embodiment, as illustrated in FIG. 6, the 2DEG suppression layer 14 is formed at the same position as that in each of the first and second embodiments, and the trap suppression layer 31 is formed only on the source electrode 19s side therefrom. The buffer layer 13 contacts the electron transit layer 15 on the drain electrode 19d side relative to the 2DEG suppression layer 14. The other structures are the same as those of the second embodiment.

The third embodiment also enables the influence of traps to be reduced, as compared with the first embodiment. In this case, the trap suppression layer 31 may be provided not on the source electrode 19s side but on the drain electrode 19d side relative to the 2DEG suppression layer 14. However, the traps generated on the source electrode 19s side have a stronger influence on the characteristics of the GaN HEMT than that of the trap generated on the drain electrode 19d side. Hence, the trap suppression layer 31 is preferably provided on the source electrode 19s side.

Figure 7A:
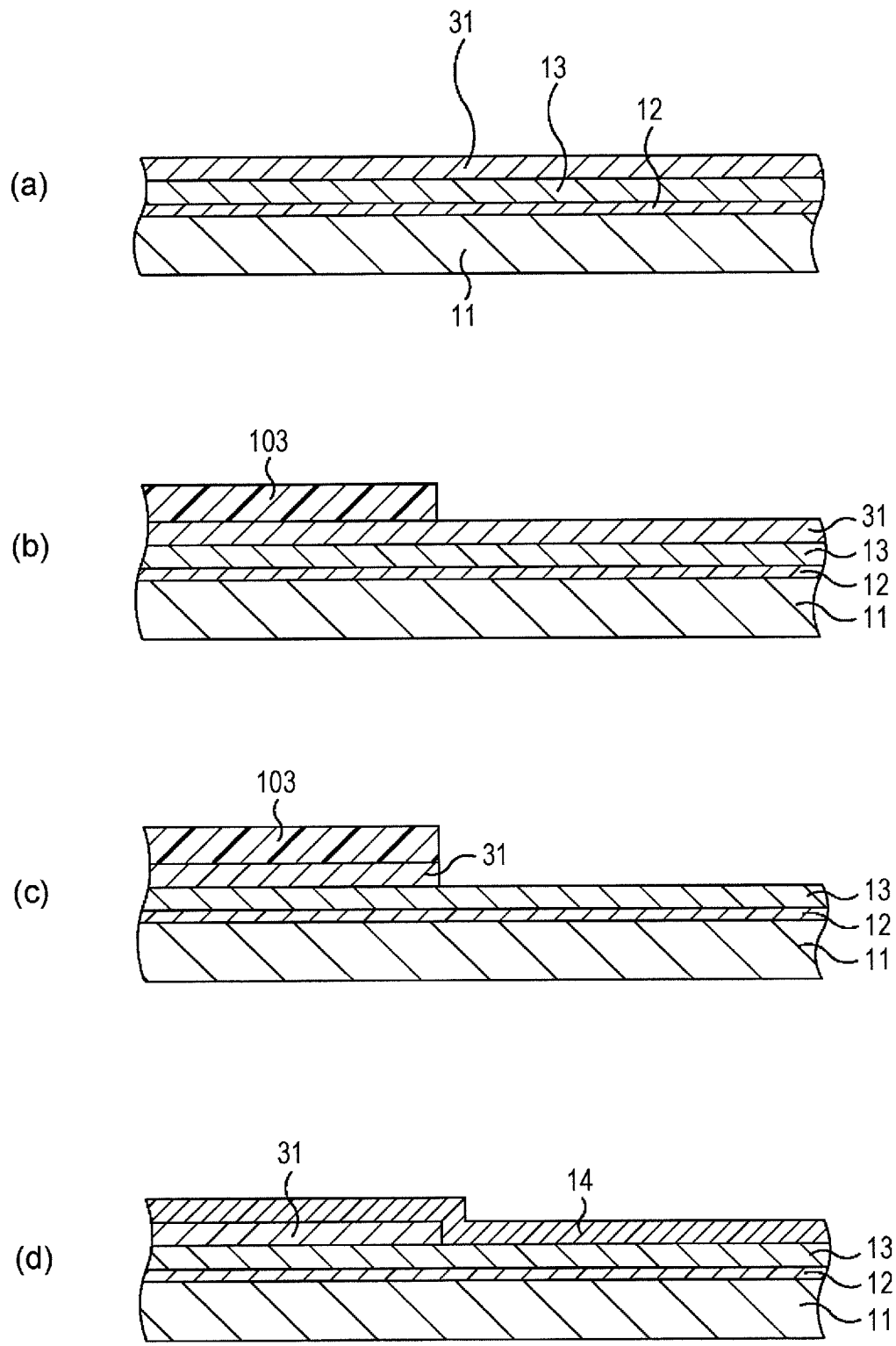
FIG. 7A is a set of cross-sectional views illustrating processes for manufacturing the compound semiconductor device according to the third embodiment in sequence.
Figure 7B:
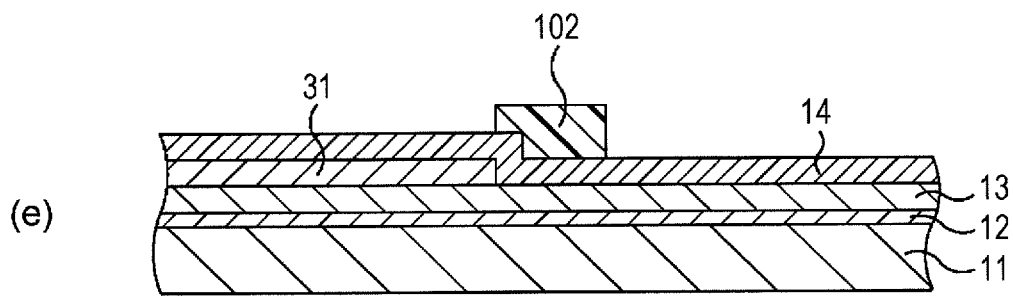
FIG. 7B is a set of cross-sectional views illustrating processes subsequent to the processes illustrated in FIG. 7A for manufacturing the compound semiconductor device according to the third embodiment in sequence.
Figure 7B:
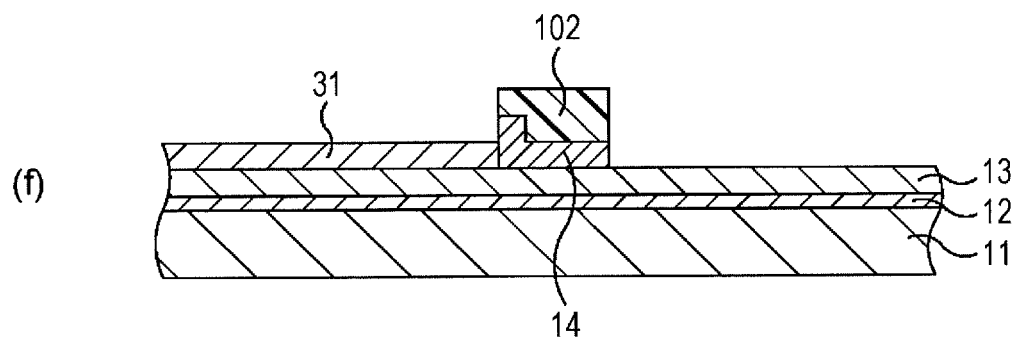
Figure 7B:
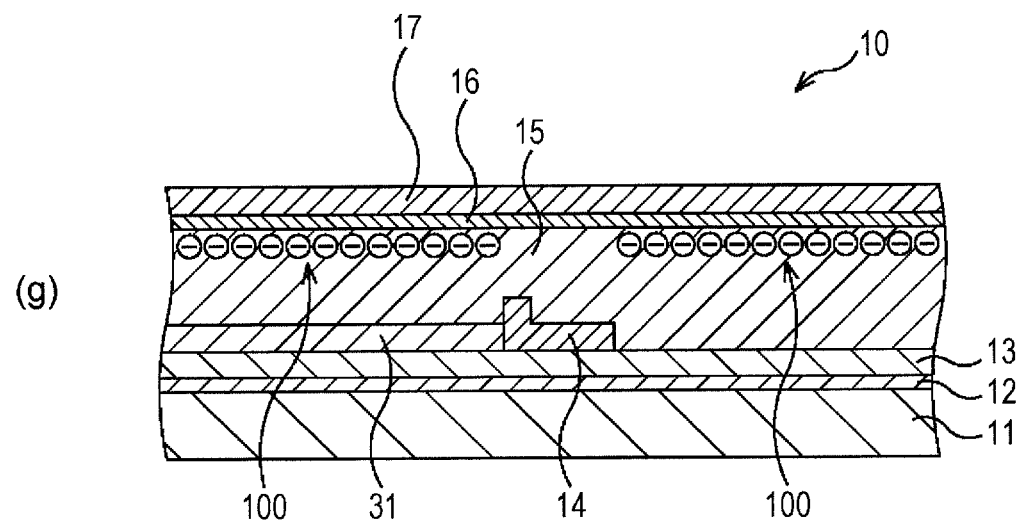
Figure 7C:
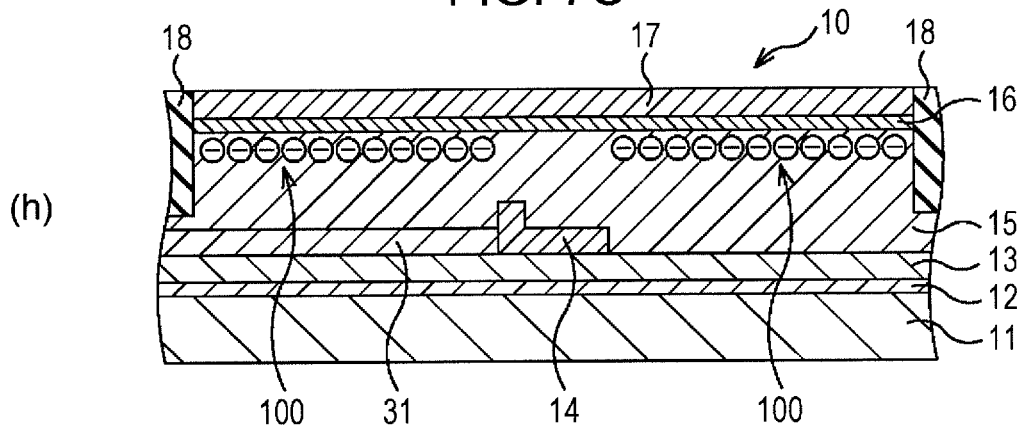
FIG. 7C is a set of cross-sectional views illustrating processes subsequent to the processes illustrated in FIG. 7B for manufacturing the compound semiconductor device according to the third embodiment in sequence.
Figure 7C:
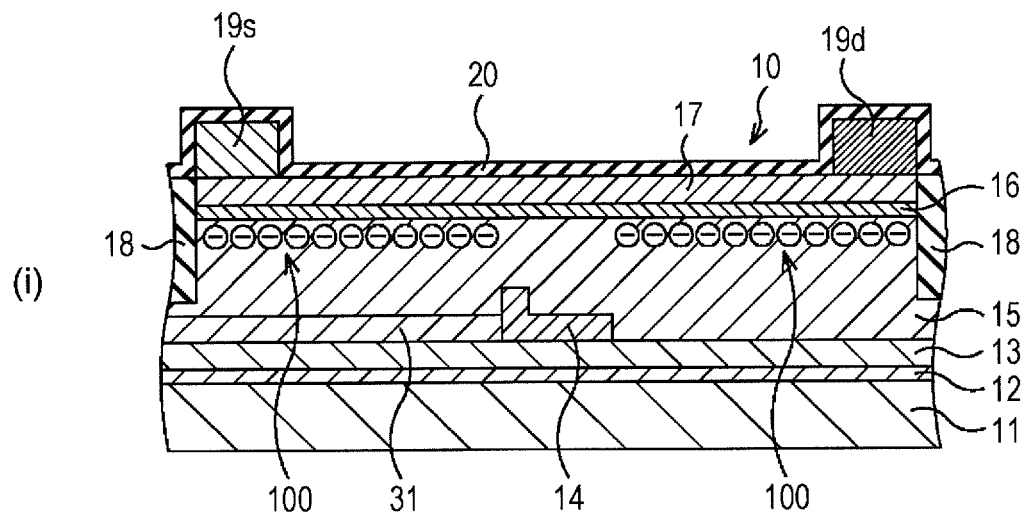
Figure 7C:
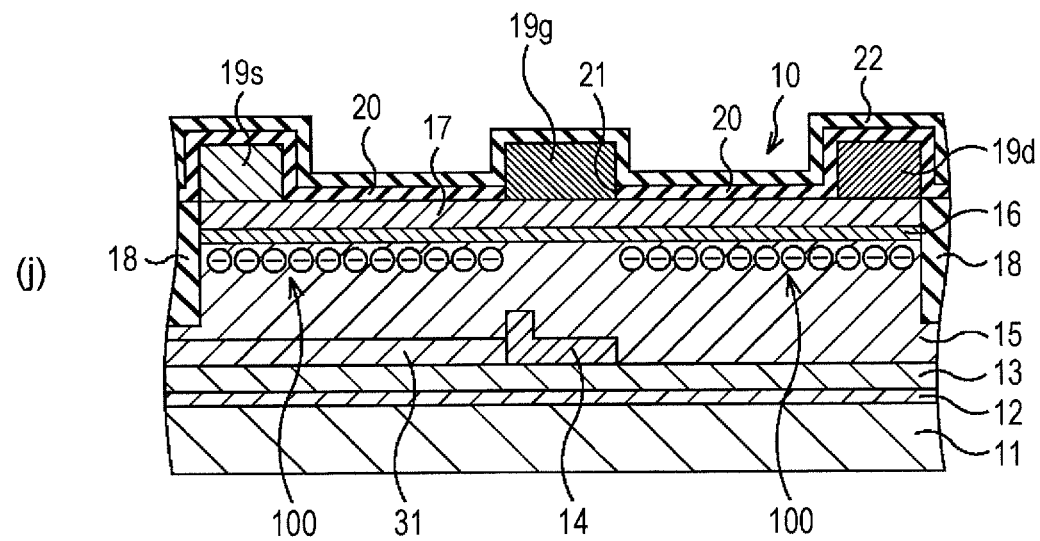

A method for manufacturing the GaN HEMT (compound semiconductor device) of the third embodiment will now be described. FIGS. 7A to 7C are cross-sectional views each illustrating a method for manufacturing the GaN HEMT (compound semiconductor device) of the third embodiment in a process sequence.

As illustrated in FIG. 7A, in Process (a), the same procedures as those in the second embodiment are carried out until the formation of the trap suppression layer 31. As illustrated in FIG. 7A, in Process (b), a resist pattern 103 is then formed on the trap suppression layer 31 such that the site to be left as the trap suppression layer 31 is covered and the other region is exposed. Then, in Process (c) in FIG. 7A, a dry etching procedure utilizing the resist pattern 103 as an etching mask is carried out to remove the other region of the trap suppression layer 31 than the site covered with the resist pattern 103. The resist pattern 103 is subsequently removed. Then, in Process (d) in FIG. 7A, the 2DEG suppression layer 14 is formed so as to overlie the buffer layer 13 and the trap suppression layer 31.

As illustrated in FIG. 7B, in Process (e), a resist pattern 102 is then formed on the 2DEG suppression layer 14 such that the site to be left as the 2DEG suppression layer 14 is covered and the other region is exposed. Then, in Process (f) in FIG. 7B, a dry etching procedure utilizing the resist pattern 102 as an etching mask is carried out to remove the other region of the 2DEG suppression layer 14 than the site covered with the resist pattern 102. The resist pattern 102 is subsequently removed. Then, in Process (g) in FIG. 7B, the electron transit layer 15 is formed on the trap suppression layer 31 so as to cover the 2DEG suppression layer 14 as in the first embodiment, and the spacer layer 16 and the electron supply layer 17 are formed so as to overlie the electron transit layer 15. These processes enable production of the compound semiconductor multilayer structure 10 including the initial layer 12, the buffer layer 13, the 2DEG suppression layer 14, the electron transit layer 15, the spacer layer 16, the electron supply layer 17, and the trap suppression layer 31. The 2DEG 100 is generated in the vicinity of the upper surface of the electron transit layer 15 except the region just above the 2DEG suppression layer 14.

As illustrated in FIG. 7C, in Process (h), the device isolation region 18 is then provided to the compound semiconductor multilayer structure 10 as in the first embodiment. Then, in Process (i) in FIG. 7C, as in the first embodiment, the source electrode 19s and the drain electrode 19d are formed, and the insulating film 20 is formed on the electron supply layer 17. Then, in Process (j) in FIG. 7C, the subsequent procedures from the formation of the opening 21 are carried out.

These processes enable the GaN HEMT of the third embodiment to be produced.

Fourth Embodiment

Figure 8:
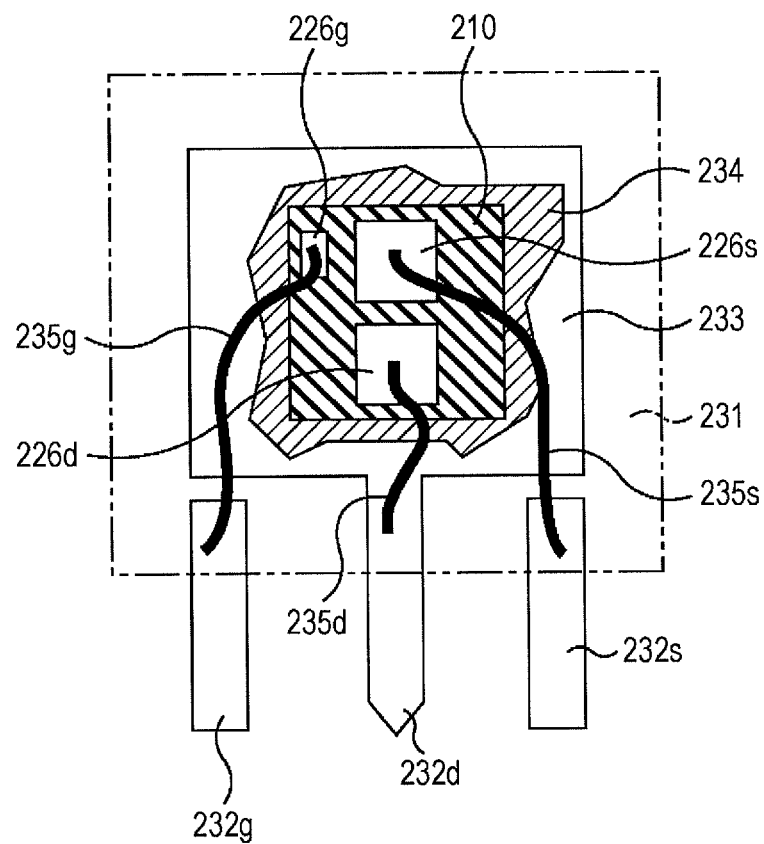
FIG. 8 illustrates a discrete package according to a fourth embodiment.

A fourth embodiment relates to a discrete package of compound semiconductor devices including a GaN HEMT. FIG. 8 illustrates a discrete package of the fourth embodiment.

In the fourth embodiment, the rear surface of a HEMT chip 210 being the compound semiconductor device of any of the first to third embodiments is fixed to a land (die pad) 233 with a die attach material 234, such as solder, as illustrated in FIG. 8. A drain pad 226d connected to the drain electrode 19d is connected to an end of a wire 235d such as an Al wire, and the other end of the wire 235d is connected to a drain lead 232d integrated with the land 233. A source pad 226s connected to the source electrode 19s is connected to an end of a wire 235s such as an Al wire, and the other end of the wire 235s is connected to a source lead 232s provided separately from the land 233. A gate pad 226g connected to the gate electrode 19g is connected to an end of a wire 235g such as an Al wire, and the other end of the wire 235g is connected to a gate lead 232g provided separately from the land 233. The land 233 and the HEMT chip 210 and other components are packaged by a molding resin 231 such that the gate lead 232g, the drain lead 232d, and the source lead 232s partially protrude from the package.

Such a discrete package may be, for instance, produced as follows. The HEMT chip 210 is fixed to the land 233 of a lead frame with the die attach material 234 such as solder. Then, the wire 235g is bonded to the gate pad 226g and the gate lead 232g of the lead frame to bring them into connection, the wire 235d is bonded to the drain pad 226d and the drain lead 232d of the lead frame to bring them into connection, and the wire 235s is bonded to the source pad 226s and the source lead 232s of the lead frame to bring them into connection. The product is then sealed with the molding resin 231 through a transfer molding process. The lead frame is subsequently removed.

Fifth Embodiment

Figure 9:
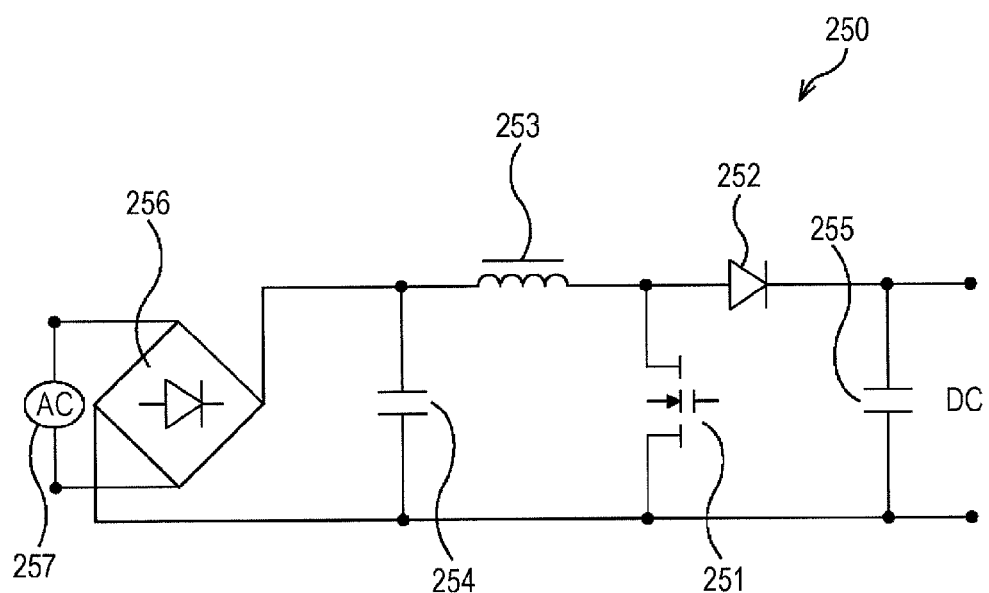
FIG. 9 is a schematic connecting diagram illustrating a power factor correction (PFC) circuit according to a fifth embodiment.

A fifth embodiment will now be described. The fifth embodiment relates to a power factor correction (PFC) circuit provided with compound semiconductor devices including a GaN HEMT. FIG. 9 is a schematic diagram illustrating the PFC circuit of the fifth embodiment.

A PFC circuit 250 includes a switching device (transistor) 251, a diode 252, a choke coil 253, capacitors 254 and 255, a diode bridge 256, and an alternating current source (AC) 257. The drain electrode of the switching device 251 is connected to both the anode terminal of the diode 252 and a terminal of the choke coil 253. The source electrode of the switching device 251 is connected to both a terminal of the capacitor 254 and a terminal of the capacitor 255. The other terminal of the capacitor 254 is connected to the other terminal of the choke coil 253. The other terminal of the capacitor 255 is connected to the cathode terminal of the diode 252. The gate electrode of the switching device 251 is connected to a gate driver. The AC 257 is connected between the two terminals of the capacitor 254 via a diode bridge 256. A direct current source (DC) is connected between the two terminals of the capacitor 255. In the present embodiment, the compound semiconductor device of any of the first to third embodiments is used in the switching device 251.

In production of the PFC circuit 250, for instance, the switching device 251 is bonded to the diode 252 and the choke coil 253 with solder.

Sixth Embodiment

Figure 10:
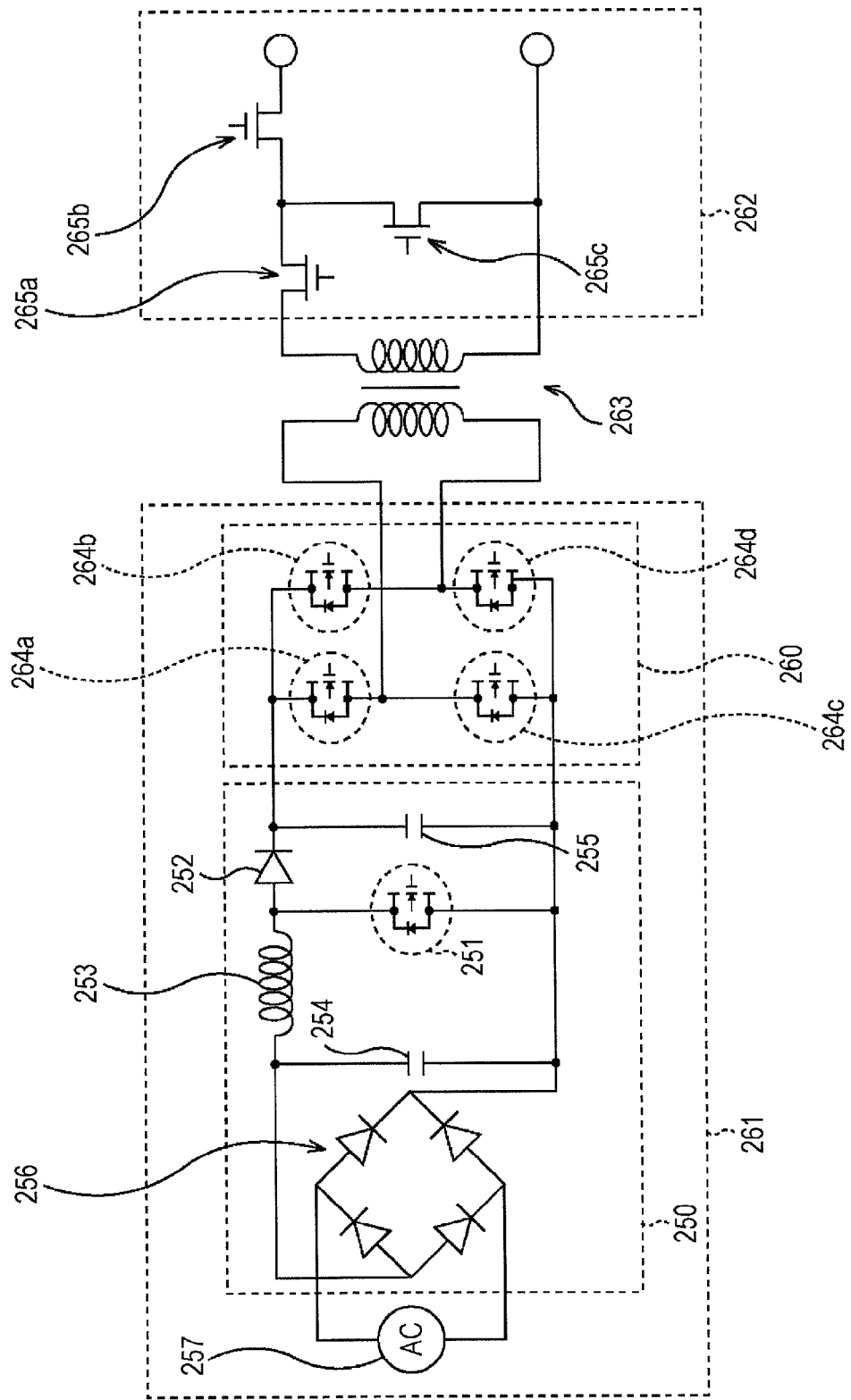
FIG. 10 is a schematic connecting diagram illustrating power supply equipment according to a sixth embodiment.

A sixth embodiment will now be described. The sixth embodiment relates to power supply equipment provided with compound semiconductor devices including a GaN HEMT. FIG. 10 is a schematic diagram illustrating the power supply equipment of the sixth embodiment.

The power supply equipment includes a high-voltage primary circuit 261, a low-voltage secondary circuit 262, and a transformer 263 provided between the primary circuit 261 and the secondary circuit 262.

The primary circuit 261 includes the PFC circuit 250 of the fifth embodiment and an inverter circuit (full bridge inverter circuit 260 in the present embodiment) connected between the two terminals of the capacitor 255 of the PFC circuit 250. The full bridge inverter circuit 260 has multiple (four in the present embodiment) switching devices 264a, 264b, 264c, and 264d.

The secondary circuit 262 has multiple (three in the present embodiment) switching devices 265a, 265b, and 265c.

In the present embodiment, the compound semiconductor device of any of the first to third embodiments is employed in the switching device 251 of the PFC circuit 250 of the primary circuit 261 and in each of the switching devices 264a, 264b, 264c, and 264d of the full bridge inverter circuit 260. In contrast, a related art metal-insulator-semiconductor (MIS) field effect transistor (FET) using silicon is used in each of the switching devices 265a, 265b, and 265c of the secondary circuit 262.

Seventh Embodiment

Figure 11:
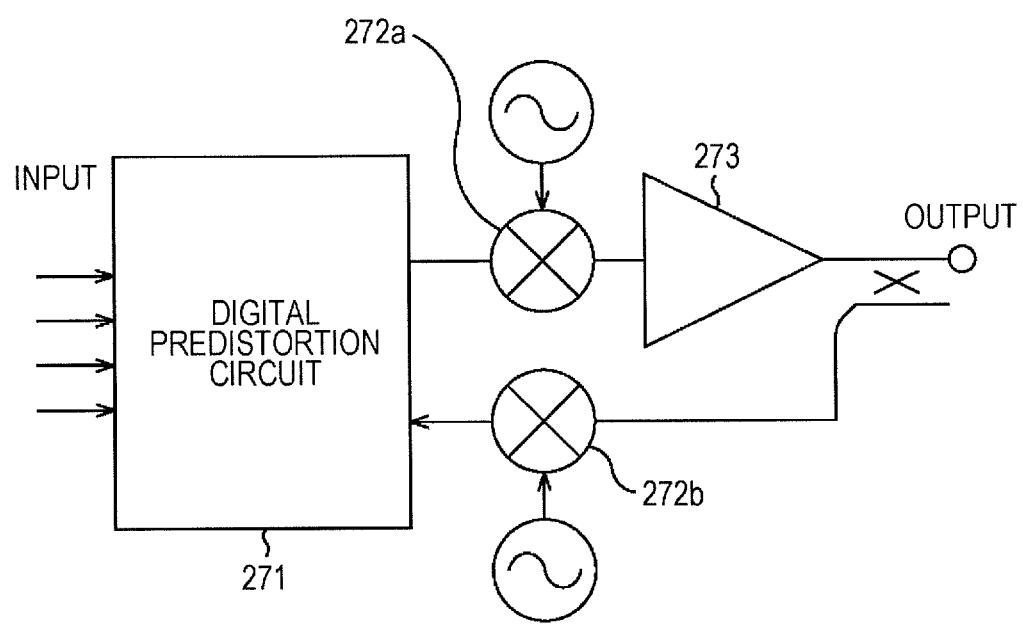
FIG. 11 is a schematic connecting diagram illustrating a high frequency amplifier according to a seventh embodiment.

A seventh embodiment will now be described. The seventh embodiment relates to a high frequency amplifier (high-power amplifier) provided with compound semiconductor devices including a GaN HEMT. FIG. 11 is a schematic diagram illustrating the high frequency amplifier of the seventh embodiment.

The high frequency amplifier includes a digital predistortion circuit 271, mixers 272a and 272b, and a power amplifier 273.

The digital predistortion circuit 271 compensates for the nonlinear distortions of input signals. The mixer 272a mixes the input signals subjected to compensation for nonlinear distortions with alternating current signals. The power amplifier 273 includes the compound semiconductor device of any of the first to third embodiments and amplifies the input signals mixed with the alternating current signals. In the present embodiment, for example, switching operation enables the mixer 272b to mix signals at the output with alternating current signals and then transmit the mixed signals to the digital predistortion circuit 271.

The compound semiconductor layers included in the compound semiconductor multilayer structure may have any composition and be composed of, for instance, GaN, AlN, or InN. The mixed crystal thereof may be used.

In each embodiment, the substrate may be a silicon carbide (SiC) substrate, a sapphire substrate, a silicon substrate, a GaN substrate, or a GaAs substrate. The substrate may have any of conductive, semi-insulating, or insulating properties.

The gate electrode, the source electrode, and the drain electrode may have any other structure than those in the embodiments described above. Each electrode may have, for instance, a single layer structure. These electrodes may be formed by any other technique than a lift-off technique. The source electrode and the drain electrode may not be heated after formation thereof, provided that ohmic characteristics are secured. The gate electrode may be heated. The gate electrode may be composed of Pd and/or Pt in addition to Ni and Au.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A compound semiconductor device comprising:
   a substrate;
   an electron transit layer and electron supply layer formed over the substrate;
   a gate electrode, source electrode, and drain electrode formed over the electron supply layer;
   a first Fe-doped layer provided between the substrate and the electron transit layer in a region corresponding to the position of the gate electrode, the first Fe-doped layer being doped with Fe to reduce two dimensional electron gas generated below the gate electrode, wherein the first Fe-doped layer includes at least a lower region and two upper regions, wherein the two upper regions are spaced apart from each other and are located at outer edges of the first Fe-doped layer; and
   a buffer layer disposed between the substrate and the electron transit layer, wherein the lower region of the first Fe-doped layer is disposed toward the buffer layer, wherein the two upper regions of the first Fe-doped layer are disposed away from the buffer layer.

2. The compound semiconductor device according to claim 1, wherein the first Fe-doped layer is doped with Fe at a concentration of not less than $1 \times 10^{17}$ cm$^{-3}$.

3. The compound semiconductor device according to claim 1, wherein the first Fe-doped layer is doped with Fe at a concentration of not less than $2 \times 10^{17}$ cm$^{-3}$.

4. The compound semiconductor device according to claim 1, wherein the first Fe-doped layer is a GaN layer.

5. The compound semiconductor device according to claim 1, further comprising:
   a second Fe-doped layer provided between the substrate and the electron transit layer on the source electrode side relative to the first Fe-doped layer, the second Fe-doped layer being doped with Fe at a concentration lower than the Fe concentration of the first Fe-doped layer.

6. The compound semiconductor device according to claim 5, wherein the second Fe-doped layer is doped with Fe at a concentration less than $1 \times 10^{17}$ cm$^{-3}$.

7. The compound semiconductor device according to claim 5, wherein the second Fe-doped layer is doped with Fe at a concentration not more than $5 \times 10^{16}$ cm$^{-3}$.

8. The compound semiconductor device according to claim 1, further comprising:
   a third Fe-doped layer provided between the substrate and the electron transit layer on the drain electrode side relative to the first Fe-doped layer, the third Fe-doped layer being doped with Fe at a concentration lower than the Fe concentration of the first Fe-doped layer.

9. The compound semiconductor device according to claim 8, wherein the third Fe-doped layer is doped with Fe at a concentration less than $1 \times 10^{17}$ cm$^{-3}$.

10. The compound semiconductor device according to claim 8, wherein the third Fe-doped layer is doped with Fe at a concentration not more than $5 \times 10^{16}$ cm$^{-3}$.

11. The compound semiconductor device according to claim 1, wherein the electron transit layer and the electron supply layer include a GaN material.

12. A power supply equipment comprising:
the compound semiconductor device according to claim 1.

13. A high frequency amplifier comprising:
the compound semiconductor device according to claim 1.

* * * * *